(12) United States Patent
Hayashi et al.

(10) Patent No.: US 7,973,281 B2
(45) Date of Patent: Jul. 5, 2011

(54) SEMICONDUCTOR SUBSTRATE, SUBSTRATE INSPECTION METHOD, SEMICONDUCTOR DEVICE MANUFACTURING METHOD, AND INSPECTION APPARATUS

(75) Inventors: Hiroyuki Hayashi, Yokohama (JP); Takamitsu Nagai, Yokohama (JP); Tomonobu Noda, Oita (JP); Kenichi Kadota, Yokohama (JP); Hisaki Kozaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/458,343

(22) Filed: Jul. 8, 2009

(65) Prior Publication Data
US 2009/0272901 A1 Nov. 5, 2009

Related U.S. Application Data

(62) Division of application No. 11/730,818, filed on Apr. 4, 2007, now Pat. No. 7,573,066.

(30) Foreign Application Priority Data

Apr. 5, 2006 (JP) .................... 2006-104289

(51) Int. Cl.
*G01N 23/00* (2006.01)
(52) U.S. Cl. ........................................ 250/310
(58) Field of Classification Search ........... 250/310
See application file for complete search history.

(56) References Cited

U.S. PATENT DOCUMENTS

| | | | |
|---|---|---|---|
| 5,923,048 A | 7/1999 | Inoue | |
| 6,091,249 A | 7/2000 | Talbot et al. | |
| 6,297,644 B1 | 10/2001 | Jarvis et al. | |
| 6,495,856 B2 | 12/2002 | Kikuchi | |
| 6,771,806 B1 | 8/2004 | Satya et al. | |
| 7,679,083 B2 * | 3/2010 | Sun et al. ................... | 257/48 |
| 2004/0084671 A1 | 5/2004 | Song et al. | |

OTHER PUBLICATIONS

Hayashi et al., "Development of voltage contrast defect inspection technique for line monitoring 300mm ULSI hp90 logic contact layer," Microlithography Proceedings of SPIE (2004), 5752:997-1008.

* cited by examiner

*Primary Examiner* — Kiet T Nguyen
(74) *Attorney, Agent, or Firm* — Finnegan, Henderson, Farabow, Garrett & Dunner, L.L.P.

(57) ABSTRACT

A semiconductor substrate inspection method includes: generating a charged particle beam, and irradiating the charged particle beam to a semiconductor substrate in which contact wiring lines are formed on a surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate; detecting at least one of a secondary charged particle, a reflected charged particle and a back scattering charged particle generated from the surface of the semiconductor substrate to acquire a signal; generating an inspection image with the signal, the inspection image showing a state of the surface of the semiconductor substrate; and judging whether the semiconductor substrate is good or bad from a difference of brightness in the inspection image obtained from the surfaces of the adjacent contact wiring lines.

18 Claims, 8 Drawing Sheets

|  | METHOD ACCORDING TO PRIOR ART | SUBSTRATE INSPECTION METHOD ACCORDING TO ONE EMBODIMENT OF PRESENT INVENTION |
|---|---|---|
| SHORTEST WAFER PRODUCTION PERIOD (BASIC STEP-PROCESS TERMINATING STEP) | 36 DAYS | 10 DAYS |
| ELECTRIC PROPERTY ANALYZING TIME | 2 HOURS | — |
| INSPECTION TIME | — | 1 HOUR |
| (SHORTEST) PERIOD OF ANALYZING SECTION OF CONTACT WIRING LINE | 7 DAYS | 7 DAYS |
| SUM | 43 DAYS AND 2 HOURS | 17 DAYS AND 1 HOUR |

FIG. 10

SEMICONDUCTOR SUBSTRATE, SUBSTRATE INSPECTION METHOD, SEMICONDUCTOR DEVICE MANUFACTURING METHOD, AND INSPECTION APPARATUS

CROSS REFERENCE TO RELATED-APPLICATION

This is a division of application Ser. No. 11/730,818, filed Apr. 4, 2007, now U.S. Pat. No. 7,573,066 which is incorporated herein by reference.

This application claims benefit of priority under 35USC §119 to Japanese patent application No. 2006-104289, filed on Apr. 5, 2006, the contents of which are incorporated by reference herein.

BACKGROUND OF THE INVENTION

1. Field of the Invention

The present invention relates to a semiconductor substrate, a substrate inspection method, a semiconductor device manufacturing method, and an inspection apparatus.

2. Related Background Art

In an in-situ defect inspection in a hole formation process of the manufacture of a semiconductor device, a defect inspection method is used, which comprises acquiring potential contrast images of the surfaces of wiring lines present in one particular chip within the surface of a wafer and comparing the potential contrast images of the surfaces of wiring lines corresponding to the above wiring lines between adjacent cells or dies in order to detect defects of the wiring lines (e.g., Japan Society for the Promotion of Science, 132nd committee, 24th LSI testing symposium/2004, "Line monitoring method by potential contrast defect detection, P77-83", Microlithography Proceedings of SPIE Vol. 5752 (2004), pp. 997-1008/"Development of voltage contrast inspection technique for line monitoring 300 mm ULSI hp 90 logic contact layer").

Defect inspection methods of this type are generally called a cell-to-cell image comparison inspection method and a die-to-die image comparison inspection method. The cell-to-cell image comparison inspection method is used to inspect a die such as a memory device having repetitive wiring lines. While the die-to-die image comparison inspection method is used to inspect a die such as a logic device having no repetitive wiring lines. Conventionally, an electron beam is irradiated to the surface of such a semiconductor device to acquire a potential contrast image, and from this image, critical defects (breaking of a wire and a short circuit of the wiring line) which present in a lower layer of the wiring line are detected by watching a difference in potential contrast in the surfaces of the wiring lines.

However, for example, in the case of a defective product having a high leak current value (leak current value: ~E−5A) in which there is a short circuit between adjacent contact holes due to the presence of a void in an insulating film between these contact holes (hereinafter referred to as a "short between contact wiring lines".), there is no difference of signal intensity between the image of this defective product and the image of a nondefective product, so that it is impossible for the inspection method described above to judge the short as a defect from the value of a difference between the signal intensities, causing difficulty in inspection. The reason is as follows: the contact wiring lines have direct or indirect electric conduction to a substrate at the bottoms of the contact holes even in the case of the defective product (the short between the contact wiring lines) (e.g., resistance value: 10Ω or less), and the contact wiring lines have direct or indirect electric conduction to a substrate at the bottoms of the contact holes in the comparative nondefective product as well (e.g., resistance value: 10Ω or less), so that the quantity of charges on the surfaces of the contact wiring lines is equal in the nondefective product and the defective product. As a result, the prior arts have a problem of decreased inspection accuracy.

SUMMARY OF THE INVENTION

According to a first aspect of the present invention, there is provided a semiconductor substrate comprising a test element group (TEG), the test element group including:

a semiconductor layer;

first insulating films disposed at arbitrary intervals in a test region on a surface of the semiconductor layer;

a second insulating film formed so as to cover the semiconductor layer and the first insulating films in the test region;

contact holes or via holes formed in the second insulating film and repetitively formed so that the semiconductor layer and the first insulating films are alternately exposed; and contact wiring lines formed of a conductive material to bury the contact holes or via holes.

According to a second aspect of the present invention, there is provided a semiconductor substrate inspection method comprising:

generating a charged particle beam, and irradiating the charged particle beam to a semiconductor substrate in which contact wiring lines are formed on a surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;

detecting at least one of a secondary charged particle, a reflected charged particle and a back scattering charged particle generated from the surface of the semiconductor substrate to acquire a signal;

generating an inspection image with the signal, the inspection image showing a state of the surface of the semiconductor substrate; and judging whether the semiconductor substrate is good or bad from a difference of brightness in the inspection image obtained from the surfaces of the adjacent contact wiring lines.

According to a third aspect of the present invention, there is provided a semiconductor device manufacturing method comprising executing a semiconductor device manufacturing process for a semiconductor substrate judged as nondefective by a semiconductor substrate inspection method, the inspection method including:

generating a charged particle beam, and irradiating the charged particle beam to a semiconductor substrate in which contact wiring lines are formed on a surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;

detecting at least one of a secondary charged particle, a reflected charged particle and a back scattering charged particle generated from the surface of the semiconductor substrate to acquire a signal;

generating an inspection image with the signal, the inspection image showing a state of the surface of the semiconductor substrate; and judging whether the semiconductor substrate is good or bad from a difference of brightness in the inspection image obtained from the surfaces of the adjacent contact wiring lines.

According to a fourth aspect of the present invention, there is provided an inspection apparatus comprising:

a charged particle beam source which generates a charged particle beam and irradiates the charged particle beam to a semiconductor substrate in which contact wiring lines are formed on the surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;

a detection unit which detects at least one of a secondary charged particle, a reflected charged particle and a back scattering charged particle generated from the surface of the semiconductor substrate to acquire a signal;

a signal processing unit which generates an inspection image with the signal, the inspection image showing a state of the surface of the semiconductor substrate; and a judging unit which judges whether the semiconductor substrate is good or bad from a difference of brightness in the inspection image obtained from the surfaces of the adjacent contact wiring lines.

DETAILED DESCRIPTION OF THE INVENTION (1) Semiconductor Substrate

Figure 1:
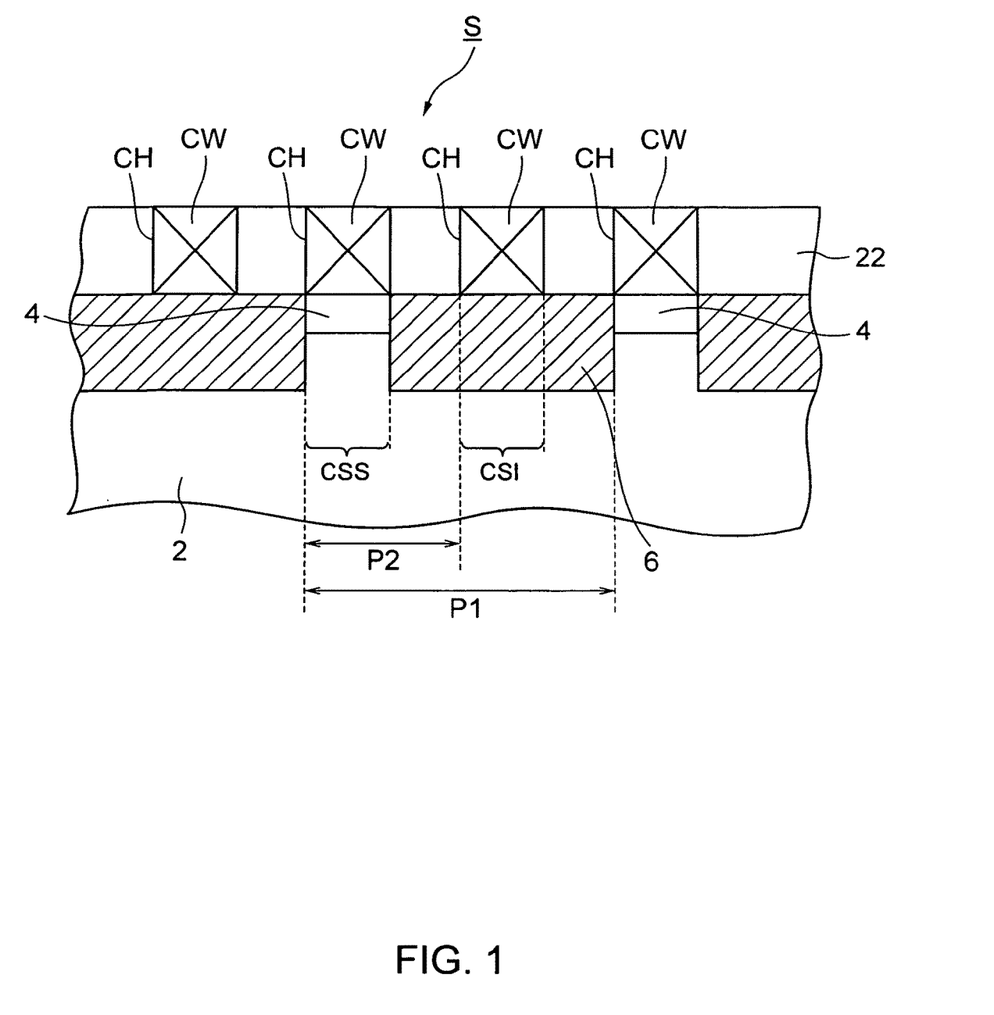
FIG. 1 is a sectional view showing a schematic configuration of a semiconductor substrate in one embodiment according to the present invention.

FIG. 1 is a sectional view showing a schematic configuration of a semiconductor substrate in one embodiment according to the present invention. The semiconductor substrate shown in FIG. 1 is characterized in that it is designed and manufactured to comprise a test element group (TEG) for analyzing a short between contact wiring lines (CWs). The test element group includes contact wiring lines (CWs) formed in contact holes or via holes. The contact holes or via holes are repetitively formed so that a semiconductor layer and first insulating films are alternately exposed. The contact wiring lines being formed of a metal material such as W (tungsten) to bury the contact holes or via holes. A more detailed description will be given below.

A semiconductor substrate S shown in FIG. 1 comprises a TEG which includes: a P-well 2 formed on a surface layer of a P-type semiconductor substrate; insulating films 6 provided at predetermined intervals P1 on a surface layer of the P-well 2; an N+-type impurity diffused layer 4 formed on the surface layer of the P-well 2 between the insulating films 6; an insulating film (e.g., SiO2) 22 formed to cover the P-well 2, the N+-type impurity diffused layer 4 and the insulating films 6; contact holes CH provided in the insulating film 22 at intervals P2; and contact wiring lines CW formed to bury the contact holes CH. The interval P2 between the contact holes CH is half of the interval P1 between the insulating films 6, and the adjacent contact holes CH are disposed so that the N+-type impurity diffused layer 4 is exposed at the bottom of one of the adjacent contact holes CH while the insulating films 6 are exposed at the bottom of the other. Thus, the contact wiring lines CW are formed in an alternately repetitive manner in a plane view so that one of the adjacent contact wiring lines CW is grounded to the semiconductor substrate via the N+-type impurity diffused layer 4 and the P-well 2 and the other of the adjacent contact wiring lines CW is insulated from the semiconductor substrate. In the present embodiment, the P-well 2 corresponds to, for example, a semiconductor layer, the insulating films 6 correspond to, for example, first insulating films, and the insulating film 22 corresponds to, for example, a second insulating film. In addition, the P-well 2 formed on the surface layer of the P-type semiconductor substrate is explained as one example of the semiconductor layer in the present embodiment, but this is not a limitation, and it should be understood that, for example, an N-type semiconductor substrate may be used as one example of the semiconductor layer.

(2) Inspection Apparatus

One embodiment of an inspection apparatus according to the present invention will be described with reference to FIG. 2.

Figure 2:
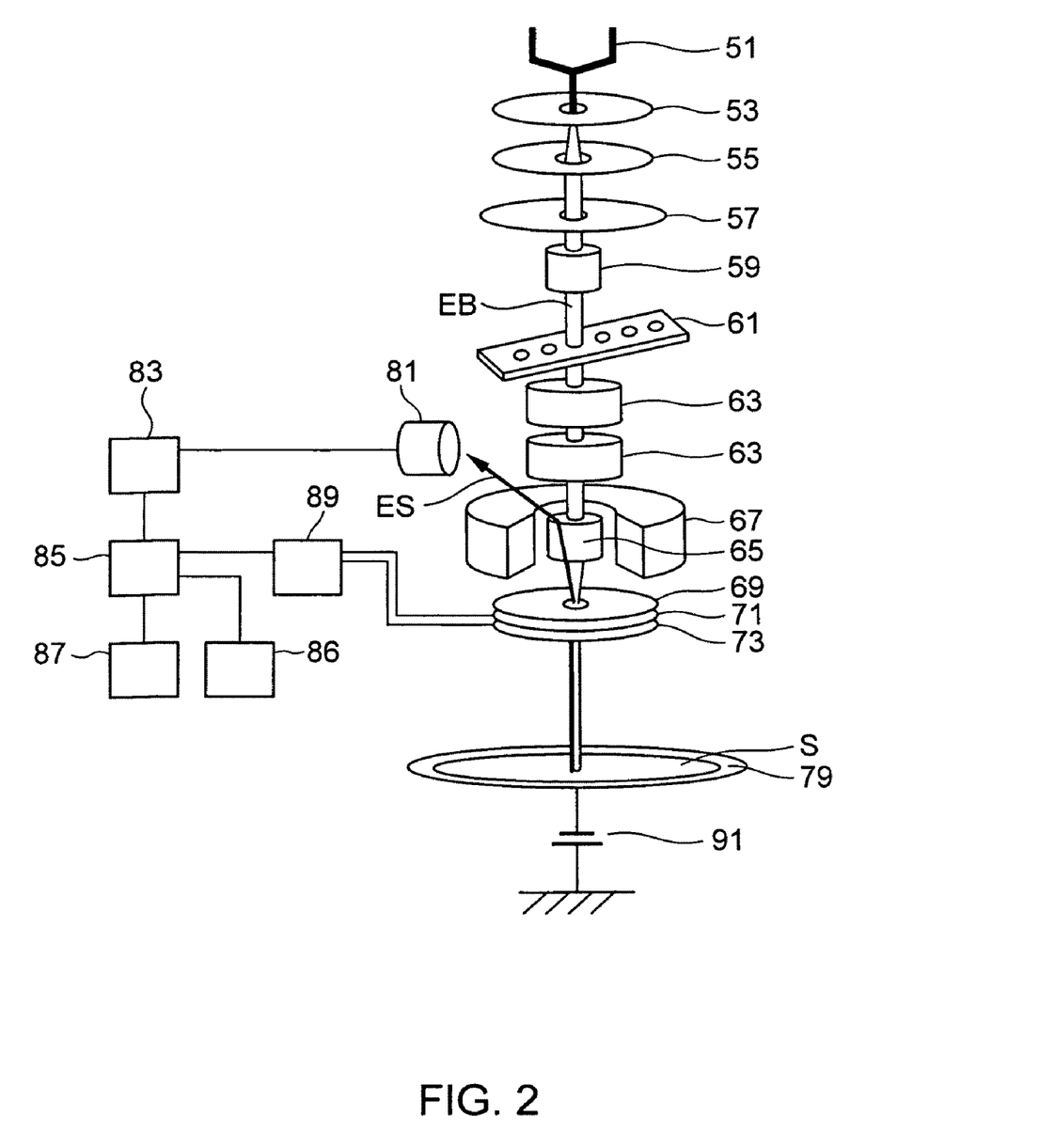
FIG. 2 is a block diagram showing a schematic configuration of an inspection apparatus in one embodiment according to the present invention.

FIG. 2 is a block diagram showing a schematic configuration of an inspection apparatus in the present one embodiment. The inspection apparatus shown in FIG. 2 comprises an electron gun 51, a suppressor electrode 53, an extraction electrode 55, a condenser lens 57, a wien filter (top) 59, an aperture 61, a beam scanning deflector 63, a wien filter (bottom) 65, an objective lens 67, a top (GND potential) electrode 69, a charge control electrode 71, a focus control electrode 73, a substrate stage 79, a secondary electron detector 81, a signal processing unit 83, a control computer 85, a memory 86, a display unit (CRT) 87, and a direct-current power source 89. The electron gun 51 generates an electron beam, and irradiates this electron beam as a primary electron beam EB to the semiconductor substrate S. The suppressor electrode 53, the extraction electrode 55, the condenser lens 57, the wien filters 59 and 65, the aperture 61, the beam scanning deflector 63, the objective lens 67, the top (GND potential) electrode 69, the charge control electrode 71 and the focus control electrode 73 constitute a electronic optical system to control the size, track, focal position, etc. of a flux of the primary electron beam EB. The control computer 85 reads a file corresponding to an inspection target from a recipe file stored in the memory 86, and controls the electron gun 51 and the electronic optical system via various unshown controllers, thereby carrying out an inspection. The direct-current power source 89 applies a direct-current voltage to the focus control electrode 73 to control the focus of the primary electron beam EB. Moreover, the direct-current power source 89 applies direct-current voltages (positive and negative) to the charge control electrode 71, and extracts from or pushes back to the surface of the semiconductor substrate S a secondary electron, a reflection electron and a back scattering electron (hereinafter simply referred to as secondary electrons, etc. Es) obtained from the surface of the semiconductor substrate S, thereby controlling the charging state (positive charging and negative charging) of the surface of the semiconductor substrate S. The semiconductor substrate S including the TEG shown in FIG. 1 is mounted on the substrate stage 79.

The primary electron beam EB emitted from the electron gun 51 is converged by the suppressor electrode 53, the extraction electrode 55 and the condenser lens 57, and enters the Wien filter 59. The Wien filter 59 causes the incident primary electron beam EB to travel straight without deflection to enter the objective lens 67. The objective lens 67 converges the primary electron beam EB to focus the primary electron beam EB on the surface of the semiconductor substrate S. The converged primary electron beam EB is deflected by the beam scanning deflector 63, and the semiconductor substrate S is scanned with this primary electron beam EB.

In response to the scanning with the primary electron beam EB, the secondary electrons, etc. Es are released from the surface of the wiring lines formed on the semiconductor substrate S, accelerated by an electric field formed between the semiconductor substrate S and the objective lens 67 to enter the Wien filter 65, and deflected by this Wien filter 65 and drawn into the secondary electron detector 81. The secondary electron detector 81 outputs a signal indicating the amount of the detected secondary electrons, etc. Es, and the signal processing unit 83 converts the received signal into an image signal and supplies the image signal to the control computer 85. The control computer 85 executes predetermined processing for the image signal received from the signal processing unit 83, and displays an image showing the state of the surface of the semiconductor substrate S by use of the display unit (CRT) 87. This image is called a potential contrast image because it has contrast corresponding to a potential distribution on the surface of the TEG. From the signal intensities within the potential contrast image obtained as described above, the control computer 85 judges by a procedure described later whether the semiconductor substrate S is defective or nondefective. A principle on which an inspection method using the inspection apparatus in FIG. 2 is based will be described below.

(3) Semiconductor Substrate Inspection Method

Figure 3:
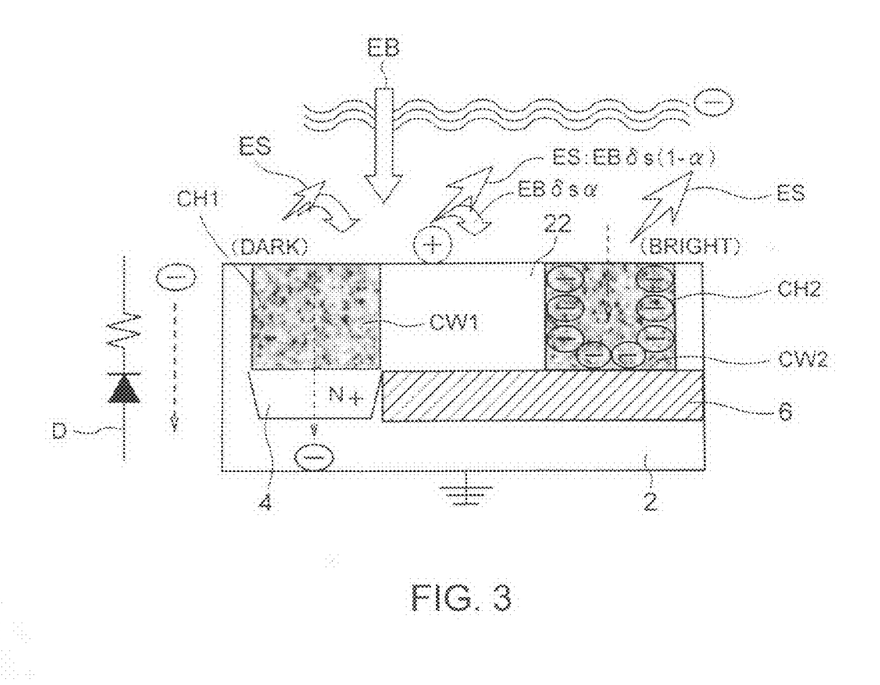
FIGS. 3 to 6 are diagrams explaining an inspection principle on which a substrate inspection method according to the present invention is based.
Figure 4:
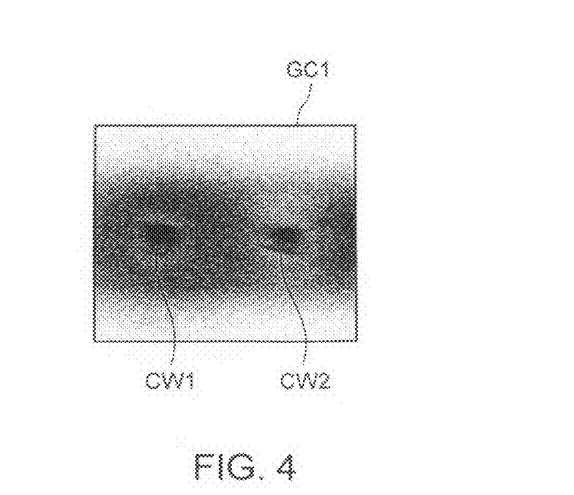

When the primary electron beam EB is irradiated to, for example, the surface of the insulating film 22 of the semiconductor substrate S including the TEG shown in FIG. 1, the surface of the insulating film 22 is charged. An emission efficiency δs of secondary electron of a silicon oxide film due to the electron beam irradiation at an incident voltage of about 900 eV is greater than 1, so that the surface of the insulating film 22 is positively charged (EBδsα). Here, α is a coefficient of the secondary electron pushed back onto the insulating film 22. It is presumed that the electron also flows into the substrate as a leak current within the insulating film 22 so that the neutralization and accumulation of the charge in the insulating film 22 are kept in parallel. FIG. 3 shows a model of charge transfer in a nondefective product. In the nondefective product, there are repetitively arranged a structure (see CSS in FIG. 1) in which a contact wiring line CW1 is connected to a P-type semiconductor substrate via the N+-type impurity diffused layer 4 and the P-well 2, and a structure (see CSI in FIG. 1) in which the insulating films 6 exist at the bottom of a contact wiring line CW2. It is presumed that when the negatively charging electron beam EB is irradiated to the surface of the contact wiring line CW1 of the nondefective product so that the electric resistance of an equivalent circuit (diode) D shown in FIG. 3 decreases (forward direction), the negative charge can transfer to the substrate. Moreover, when the negatively charging electron beam EB is irradiated to the surface of the contact wiring line CW2 of the nondefective product, the resistance value of the contact to the substrate is much higher than the resistance value of the adjacent contact wiring line CW1. As a result, it is anticipated that the amount of negative charge accumulation increases as shown in FIG. 3. The transfer of the negative charge results in a difference in charge-up amount, so that the surface of the contact wiring line CW1 of the nondefective product is observed as a dark contrast image (see a left half of an image GC1 in FIG. 4), while the surface of the contact-wiring line CW2 of the nondefective product is observed as a bright part (see a right half of the image GC1 in FIG. 4). Thus, dark parts and bright parts are repetitively observed in the nondefective product, as shown in FIG. 4.

Figure 5:
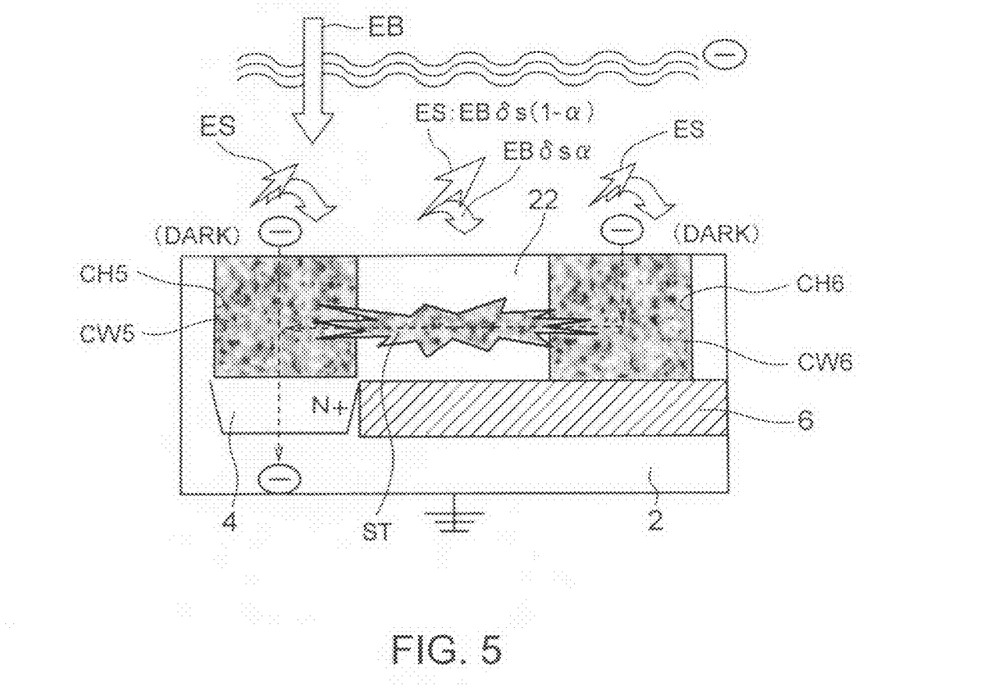
Figure 6:
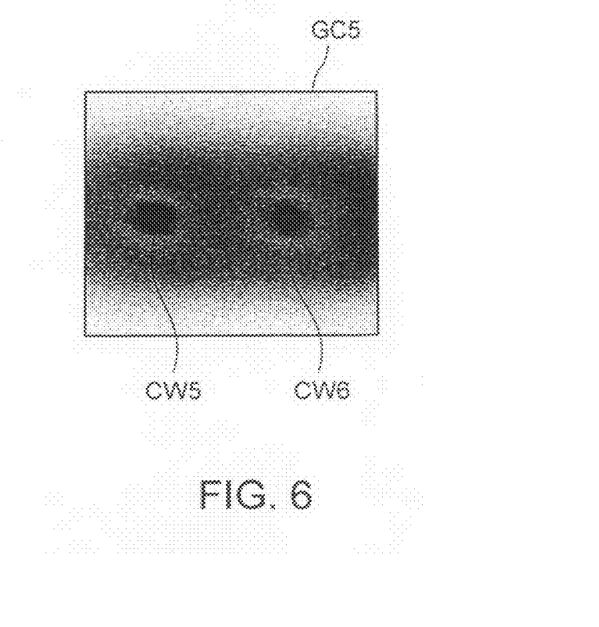

A model of charge transfer in a defective product is shown in FIG. 5. In the defective product, there is a void in the insulating film 22 between adjacent contact holes CH5 and CH6, and a short ST is caused between the contact wiring lines. It is presumed that when the negatively charging electron beam EB is irradiated to the surface of the contact wiring line CW5 of the defective product so that the electric resistance of the above-mentioned equivalent circuit (diode) D decreases (forward direction), the negative charge can transfer to the substrate. Moreover, it is presumed that when the negatively charging electron beam EB is irradiated to the surface of the contact wiring line CW6 of the defective product, the negative charge can transfer to the substrate via the short ST. The transfer of the negative charge results in a difference in charge-up amount in comparison with a nondefective product, so that the surface of the contact wiring line CW5 of the defective product is observed as a dark contrast image (see a left half of an image GC5 in FIG. 6), while the surface of the contact wiring line CW6 of the defective product is also observed as a dark part (see a right half of the image GC5 in FIG. 6). Thus, both of the contact wiring lines CW5 and CW6 are observed as the dark contrast images in the defective product, as shown in FIG. 6. In this manner, a defective product can be recognized from a difference image of the potential contrast images obtained from the surfaces of the wiring lines in the nondefective product (a region of CW2 in FIG. 4) and the defective product (a region of CW6 in FIG. 6).

Specifically, a TEG is prepared, which is formed so that it repeats the sequence of being grounded to and insulated from a foundation semiconductor layer, and the semiconductor substrate including such a TEG is scanned with the primary electron beam to acquire a potential contrast image. When the TEG is nondefective, the surface of the contact wiring line adjacent to the contact wiring line having a bright part is observed to have a dark part and to be different in terms of contrast even in visual observation, as shown in the potential contrast image GC1 in FIG. 4. On the contrary, in the case of a defective product (e.g., leak current value: ~E−5A) in which there is, for example, a void in the insulating film 22 between the adjacent contact holes and a short is caused between the contact wiring lines CW5 and CW6, for example, as shown in FIG. 5, the charge (negative) on the surfaces of the contact wiring lines CW5 and CW6 can transfer to the P-well 2 via the shorted portion ST. Therefore, there is no difference in the amount of charge on the surfaces of the contact wiring lines CW5 and CW6. Consequently, the surfaces of the contact wiring lines CW5 and CW6 are visually observed to be the same in terms of contrast on the potential contrast image GC5, as shown in FIG. 6.

Thus, according to the semiconductor substrate in the present embodiment, a defect can be recognized from the value of a difference between signal intensities because the difference of signal intensities between the nondefective product and the defective product is produced between corresponding regions within the potential contrast image. This makes it possible to easily inspect for a fault or defect.

One embodiment of the semiconductor substrate inspection method according to the present invention will be specifically described with reference to FIGS. 7 and 8.

Figure 7:
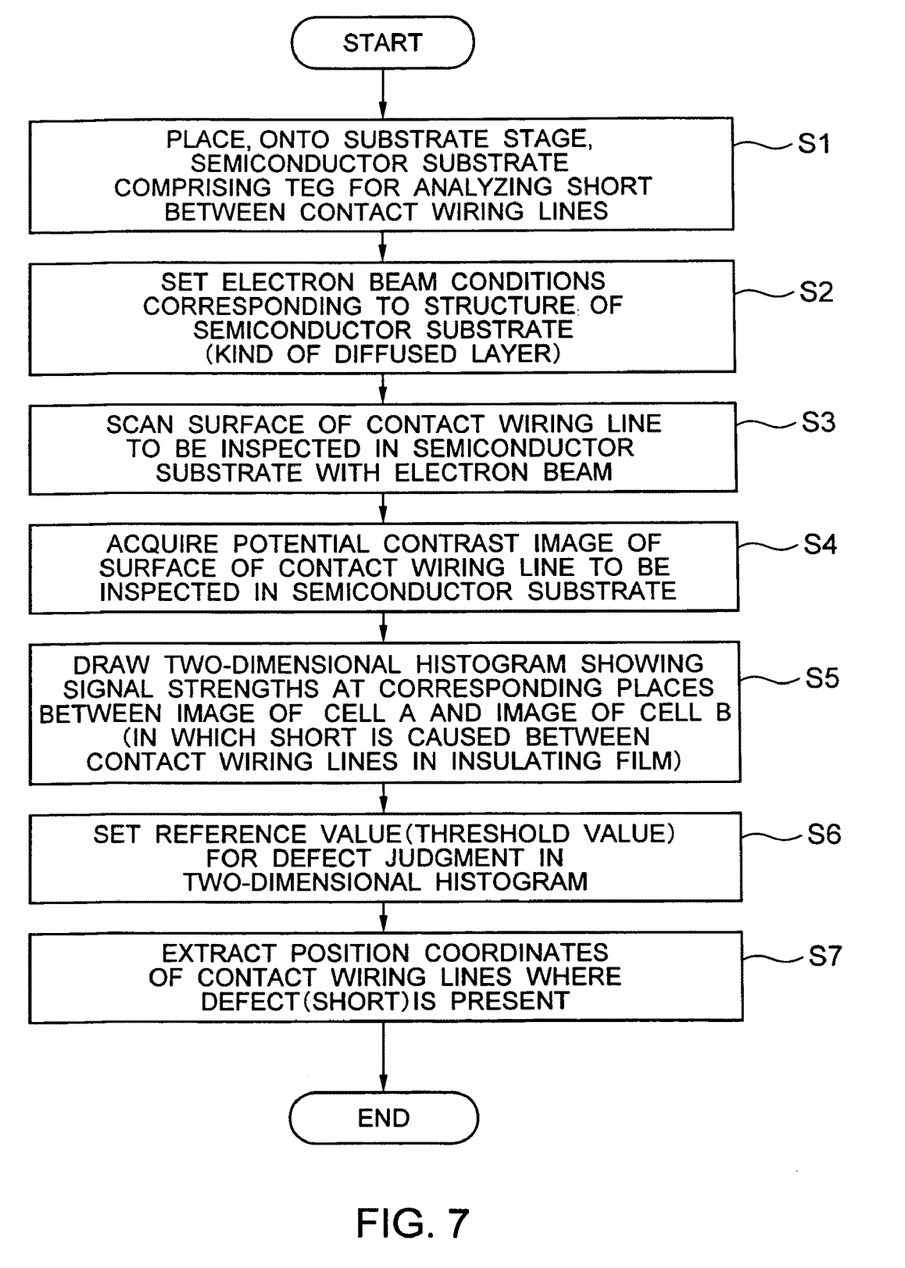
FIG. 7 is a flowchart showing a schematic procedure of the substrate inspection method in one embodiment according to the present invention.
Figure 8:
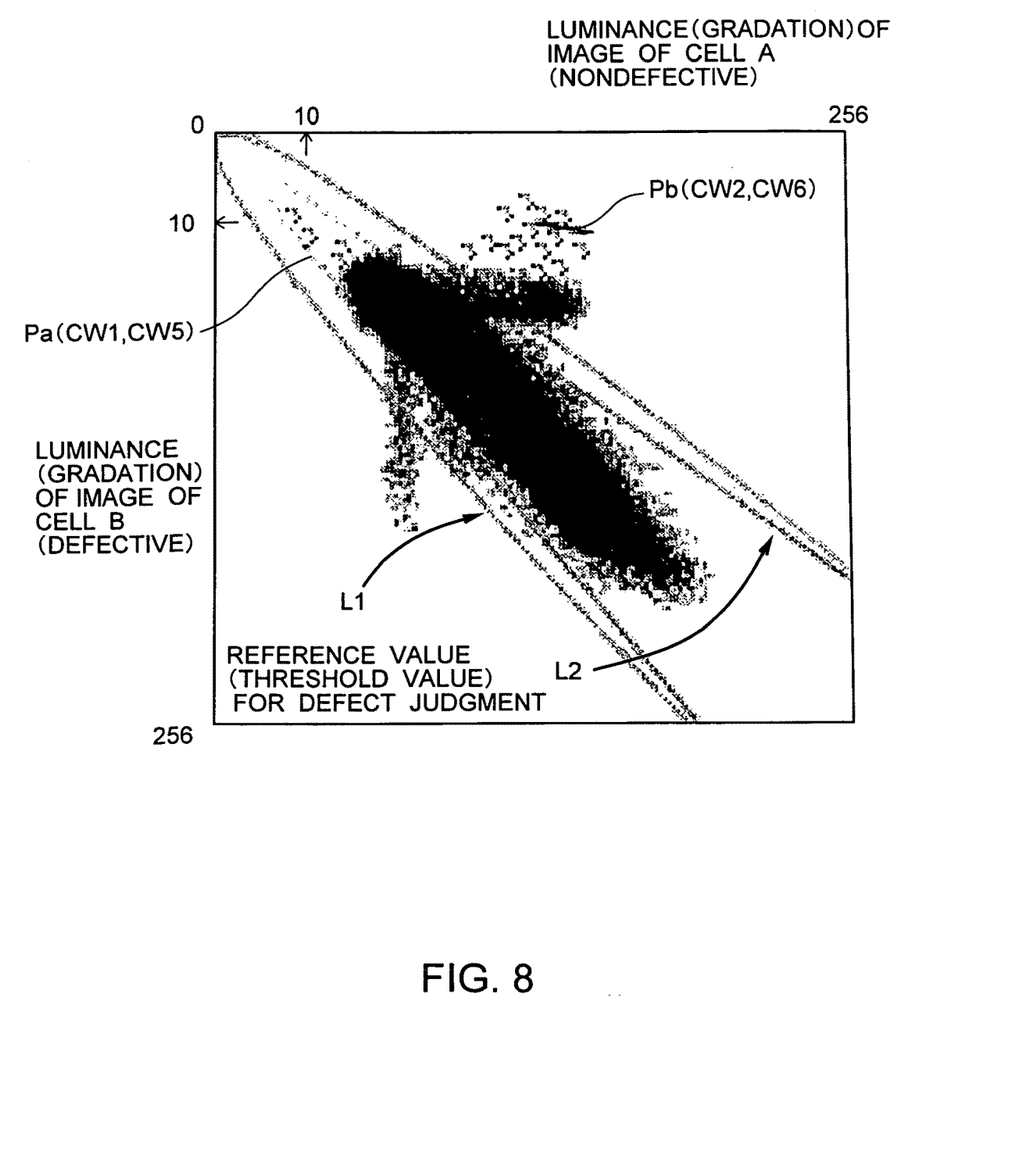
FIG. 8 is a diagram showing one example of a two-dimensional histogram for use in the substrate inspection method shown in FIG. 7.

FIG. 7 is a flowchart showing a schematic procedure of the substrate inspection method in the present embodiment. First, the semiconductor substrate S to be inspected is placed onto the substrate stage 79 of the substrate inspection apparatus in FIG. 2 (step S1). As shown in FIG. 1, the semiconductor substrate S comprises a TEG for analyzing a short between contact wiring lines in which there are repetitively arranged a structure CSS where a semiconductor layer 2 exist at the bottom of a contact hole CH and a structure CSI where the insulating films 6 exist at the bottom of the adjacent contact hole.

Next, conditions of the electron beam are set in accordance with the structure of the semiconductor substrate (step S2). The semiconductor substrate S used in the present embodiment has a structure including the N+-type impurity diffused layer 4, the P-well 2 and the P-type semiconductor substrate. Therefore, taking into consideration the charge transfer model for the short between the contact wiring lines, electrode beam conditions including, for example, an incident voltage of about 900 eV, a probe current of 60 nA and a charge control voltage of −40 V are employed, under which the charge applied to the surface of the contact wiring line becomes a negative charge capable of transferring to the P-type semiconductor substrate.

Subsequently, the control computer 85 selects, from the memory 86, a previously created recipe file including information on an inspection target region and information necessary for the defect inspection, and starts an inspection after the alignment of a wafer. The surface of the contact wiring line to be inspected in the semiconductor substrate. S is scanned with the primary electron beam EB while the substrate stage 79 is being actuated (step S3), and the secondary electrons, etc. obtained from the surface of the contact wiring line are detected to acquire a potential contrast image (step S4). The acquired potential contrast image is processed by a cell-to-cell image comparison inspection method or a die-to-die image comparison inspection method, and defect position coordinates are extracted from a difference image. The flow shown in FIG. 7 employs the cell-to-cell image comparison inspection method. In the present embodiment, the luminance (gradation) of an image of a nondefective cell A and the luminance (gradation) of an image of a defective cell B are plotted on a two-dimensional histogram, and a reference value (threshold value) for defect judgment is set in the histogram to extract the position of a defect (steps S5 to S7).

For example, suppose that the image GC1 in FIG. 4 is the image of the cell A and that the image GC5 in FIG. 6 is the image of the cell B. In addition, in the two-dimensional histogram, for example, a vertical axis indicates the luminance (gradation) of the image of the cell B (defective), and a horizontal axis indicates the luminance (gradation) of the image of the cell A (nondefective), as shown in FIG. 8.

In this case, the surface of the contact wiring line CW1 of the nondefective product shown in FIG. 3 is observed as a dark part (see FIG. 4), and the value of its luminance is, for example, 10 in gradation sequence. On the other hand, the surface of the contact wiring line CW5 of the defective product shown in FIG. 5 is observed as a dark part, and the value of its luminance is also 10 in gradation sequence. These luminance values are plotted on the two-dimensional histogram (a point Pa in FIG. 8, step S5).

Moreover, the surface of the contact wiring line CW2 of the cell A (nondefective) shown in FIG. 4 is observed as a bright part, and the value of its luminance is 120 in gradation sequence. On the other hand, the surface of the contact wiring line CW6 of the cell B (defective) in FIG. 5 is observed as a dark part, and the value of its luminance is 10 in gradation sequence. These luminance values are similarly plotted on the two-dimensional histogram in FIG. 8 (a point Pb in FIG. 8, step S5).

Figure 9:
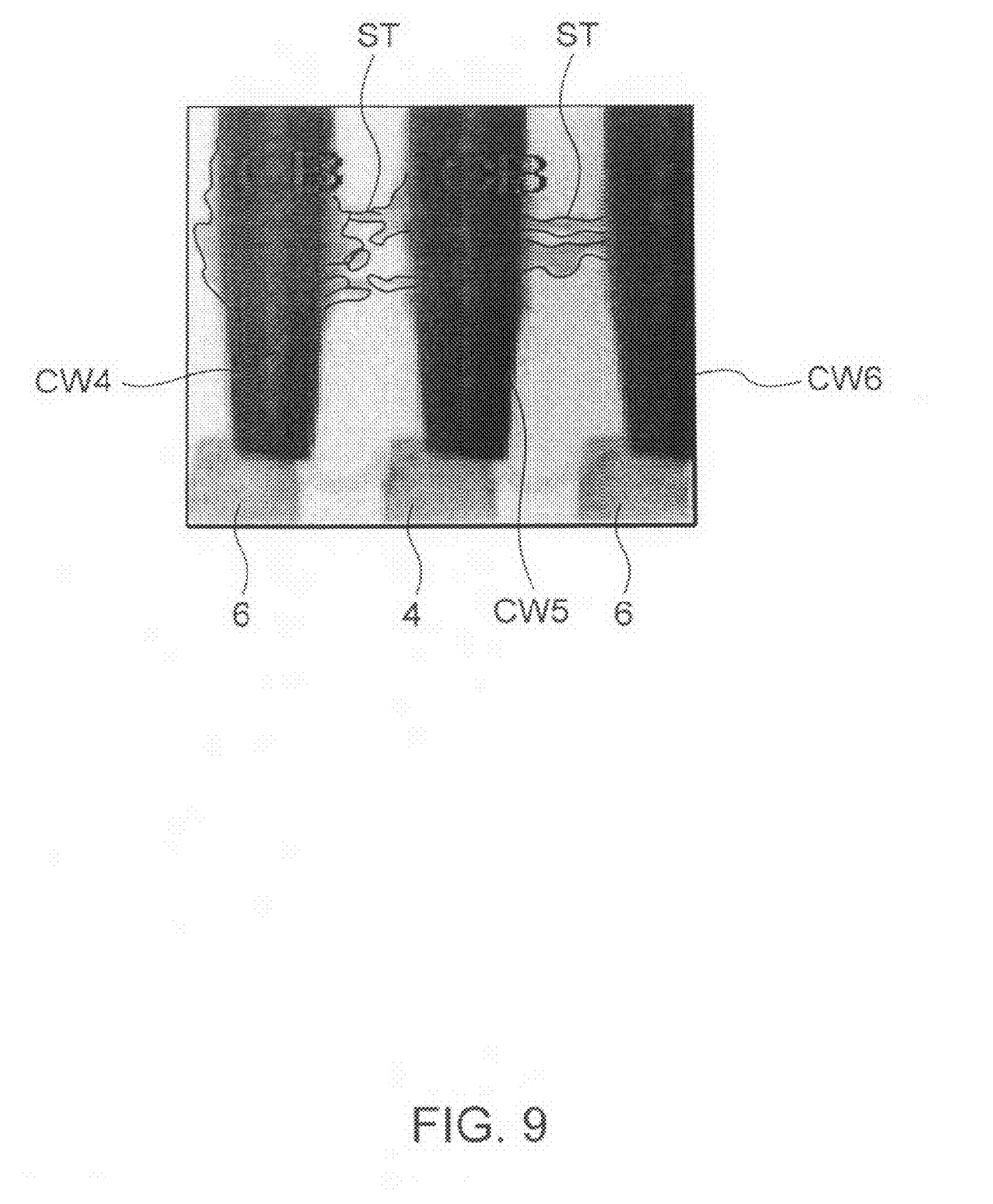
FIG. 9 is a diagram showing one example of a sectional TEM image of a short between contact wiring lines detected by the substrate inspection method shown in FIG. 7.

Furthermore, if the reference value (threshold value) for defect judgment on the two-dimensional histogram is set by, for example, two straight lines L1 and L2 whose original points are 0 in gradation sequence (step S6), the cell B can be extracted as a cell having the contact wiring line containing a defect (short) because the point Pb is included in a point group located outside the straight lines L1 and L2. In addition, if the luminance values contain position coordinates, it is possible to identify the coordinates of the position of the defect (step S7). An example is shown in FIG. 9 in which the section of the cell B is analyzed in accordance with the information on the defect position coordinates identified as described above. A void is produced among contact wiring lines CW4 to CW6 as shown in FIG. 9, such that it has been confirmed that a defect due to the short between the contact wiring lines is present as indicated by the signs ST in FIG. 9.

According to the present embodiment, it is possible to achieve a defect inspection with high accuracy as described above, and also to significantly reduce a defect analysis cycle period (TAT: turn around time).

Figure 10:
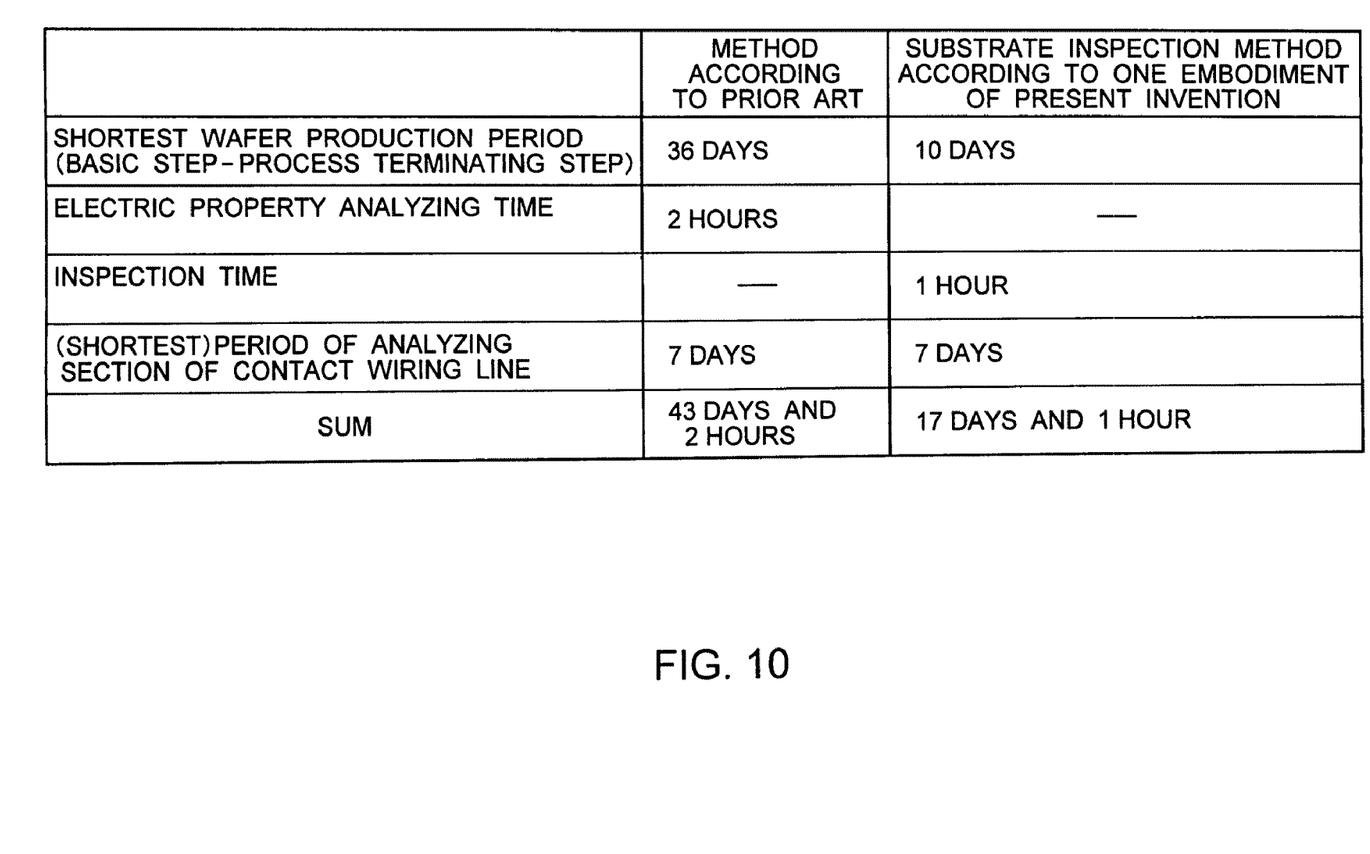
FIG. 10 is a diagram showing effects of the substrate inspection method shown in FIG. 7 in comparison with a method according to a prior art.

FIG. 10 shows results of a comparison of the TATs in a hole formation process in the middle of the manufacture of a semiconductor device between a method according to a prior art and the inspection method in the present embodiment. As shown in FIG. 10, according to the inspection method of the present embodiment, the TAT can be reduced by about one month (26 days) than that of the prior art.

(4) Semiconductor Device Manufacturing Method

When the semiconductor substrate according to the present invention described above is used and the semiconductor substrate inspection method according to the present invention described above is used in a process of manufacturing a semiconductor device, a defect inspection can be achieved with high accuracy and in a short TAT, such that the semiconductor device can be manufactured with higher yield and throughput.

More specifically, the semiconductor substrate is extracted per production lot, and a TEG in the extracted semiconductor substrate is inspected by the inspection method described above. When the semiconductor substrate is judged as a nondefective product as a result of the inspection, the rest of the manufacturing process is continuously executed for the whole production lot to which the inspected semiconductor substrate belongs. On the other hand, when the semiconductor device is judged as a defective product as a result of the inspection and can be reworked, rework processing is executed for the production lot to which the semiconductor substrate judged as the defective product belongs. When the rework processing is finished, the semiconductor substrate is extracted from the production lot and again inspected for defect. If the extracted semiconductor substrate is judged as a nondefective product as a result of the reinspection, the rest of the manufacturing process is executed for the production lot finished with the rework processing. In addition, when the rework processing is impossible, the production lot to which the semiconductor substrate judged as the defective product belongs is disposed of. When the cause of the defect can be analyzed, results of the analysis are fed back to a person in charge of designing, a person in charge of an upstream process or the like.

While some of the embodiments of the present invention have been described above, it is obvious that the present invention is not limited to the embodiments described above, and can be modified in various manners within the technical scope thereof and carried out. The cases have been described in the above embodiments where the electron beam is used as a charged particle beam, but the present invention is not limited thereto, and, for example, an ion beam can also be used as the charged particle beam.

What is claimed is:

1. A semiconductor substrate inspection method comprising:
   generating a charged particle beam, and irradiating the charged particle beam to a semiconductor substrate in which contact wiring lines are formed on a surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;
   detecting at least one of a secondary charged particle, a reflected charged particle and a back scattering charged particle generated from the surface of the semiconductor substrate to acquire a signal;
   generating an inspection image with the signal, the inspection image showing a state of the surface of the semiconductor substrate; and
   judging whether the semiconductor substrate is good or bad from a difference of brightness in the inspection image obtained from the surfaces of the adjacent contact wiring lines.

2. The inspection method according to claim 1,
   wherein the other of the adjacent contact wiring lines contacts, at the bottom thereof, first insulating films formed on the surface of the semiconductor substrate, and is thereby insulated from the semiconductor substrate.

3. The inspection method according to claim 1,
   wherein one of the contact wiring lines is directly connected to the semiconductor substrate at the bottom thereof or connected to the semiconductor substrate via an impurity diffused layer formed on the surface of the semiconductor substrate, and is thereby grounded to the semiconductor substrate.

4. The inspection method according to claim 1,
   wherein the contact wiring lines are formed to bury contact holes or via holes formed in a second insulating film, the second insulating film being formed on the semiconductor substrate so as to cover the semiconductor substrate and the first insulating films.

5. The inspection method according to claim 1,
   wherein judging whether the semiconductor substrate is good or bad includes:
   acquiring a potential contrast image for each of different cells or dies, the potential contrast image being an image with a contrast distribution corresponding to a surface potential distribution of the semiconductor substrate;
   calculating, as signal intensities, gradation values of pixels constituting the potential contrast image;
   plotting the gradation values of the pixels of the potential contrast image obtained for each of the different cells or dies into a multidimensional region whose reference axes are the gradation values of the pixels in the one and other of the adjacent contact wiring lines, thereby creating a multidimensional histogram showing an incidence of the signal intensity at places corresponding to each other between the different cells or dies; and
   drawing lines indicating a standard of defect judgment in the histogram, and judging whether a defect due to a fault in the formation of contact holes or via holes is present in the semiconductor substrate in accordance with whether a region of the multidimensional histogram defined by the lines contains pixels of the signal intensities.

6. The inspection method according to claim 5,
   wherein information on position coordinates of the pixels is added to the gradation values corresponding thereto, and
   judging whether the defect is present further includes outputting information on coordinates of the position of the defect when the defect is present in the semiconductor substrate.

7. A semiconductor device manufacturing method comprising executing a semiconductor device manufacturing process for a semiconductor substrate judged as nondefective by a semiconductor substrate inspection method, the inspection method including:
   generating a charged particle beam, and irradiating the charged particle beam to a semiconductor substrate in which contact wiring lines are formed on a surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;
   detecting at least one of a secondary charged particle, a reflected charged particle and a back scattering charged particle generated from the surface of the semiconductor substrate to acquire a signal;
   generating an inspection image with the signal, the inspection image showing a state of the surface of the semiconductor substrate; and
   judging whether the semiconductor substrate is good or bad from a difference of brightness in the inspection image obtained from the surfaces of the adjacent contact wiring lines.

8. The semiconductor device manufacturing method according to claim 7,
   wherein the other of the adjacent contact wiring lines contacts, at the bottom thereof, first insulating films formed on the surface of the semiconductor substrate, and is thereby insulated from the semiconductor substrate.

9. The semiconductor device manufacturing method according to claim 7,
   wherein one of the contact wiring lines is directly connected to the semiconductor substrate at the bottom thereof or connected to the semiconductor substrate via an impurity diffused layer formed on the surface of the semiconductor substrate, and is thereby grounded to the semiconductor substrate.

10. The semiconductor device manufacturing method according to claim 7,
wherein the contact wiring lines are formed to bury contact holes or via holes formed in a second insulating film, the second insulating film being formed on the semiconductor substrate so as to cover the semiconductor substrate and the first insulating films.

11. The semiconductor device manufacturing method according to claim 7,
wherein judging whether the semiconductor substrate is good or bad includes:
acquiring a potential contrast image for each of different cells or dies, the potential contrast image being an image with a contrast distribution corresponding to a surface potential distribution of the semiconductor substrate;
calculating, as signal intensities, gradation values of pixels constituting the potential contrast image;
plotting the gradation values of the pixels of the potential contrast image obtained for each of the different cells or dies into a multidimensional region whose reference axes are the gradation values of the pixels in the one and other of the adjacent contact wiring lines, thereby creating a multidimensional histogram showing an incidence of the signal intensity at places corresponding to each other between the different cells or dies; and
drawing lines indicating a standard of defect judgment in the histogram, and judging whether a defect due to a fault in the formation of contact holes or via holes is present in the semiconductor substrate in accordance with whether a region of the multidimensional histogram defined by the lines contains pixels of the signal intensities.

12. The semiconductor device manufacturing method according to claim 11,
wherein information on position coordinates of the pixels is added to the gradation values corresponding thereto, and
judging whether the defect is present further includes outputting information on coordinates of the position of the defect when the defect is present in the semiconductor substrate.

13. An inspection apparatus comprising:
a charged particle beam source which generates a charged particle beam and irradiates the charged particle beam to a semiconductor substrate in which contact wiring lines are formed on the surface thereof, the contact wiring lines of the semiconductor substrate being designed to alternately repeat in a plane view so that one of the adjacent contact wiring lines is grounded to the semiconductor substrate and the other of the adjacent contact wiring lines is insulated from the semiconductor substrate;
a detection unit which detects at least one of a secondary charged particle, a reflected charged particle and a back scattering charged particle generated from the surface of the semiconductor substrate to acquire a signal;
a signal processing unit which generates an inspection image with the signal, the inspection image showing a state of the surface of the semiconductor substrate; and
a judging unit which judges whether the semiconductor substrate is good or bad from a difference of brightness in the inspection image obtained from the surfaces of the adjacent contact wiring lines.

14. The inspection apparatus according to claim 13,
wherein the other of the adjacent contact wiring lines contacts, at the bottom thereof, first insulating films formed on the surface of the semiconductor substrate, and is thereby insulated from the semiconductor substrate.

15. The inspection apparatus according to claim 13,
wherein one of the contact wiring lines is directly connected to the semiconductor substrate at the bottom thereof or connected to the semiconductor substrate via an impurity diffused layer formed on the surface of the semiconductor substrate, and is thereby grounded to the semiconductor substrate.

16. The inspection apparatus according to claim 13,
wherein the contact wiring lines are formed to bury contact holes or via holes formed in a second insulating film, the second insulating film being formed on the semiconductor substrate so as to cover the semiconductor substrate and the first insulating films.

17. The inspection apparatus according to claim 13,
wherein the judging unit controls the charged particle beam source, the detection unit and the signal processing unit, thereby: acquiring, for each of different cells or dies, a potential contrast image which is an image with a contrast distribution corresponding to a surface potential distribution of the semiconductor substrate; calculating, as a signal intensity, gradation values of pixels constituting the potential contrast image; plotting the gradation values of the pixels of the potential contrast image obtained for each of the different cells or dies into a multidimensional region whose reference axes are the gradation values of the pixels in the one and other of the adjacent contact wiring lines, in order to create a multidimensional histogram showing the incidence of the signal intensity at places corresponding to each other between the different cells or dies; and drawing lines indicating a standard of defect judgment in the histogram, and judging whether a defect due to a fault in the formation of contact holes or via holes is present in the semiconductor substrate in accordance with whether a region of the multidimensional histogram defined by the lines contains pixels at the signal intensities.

18. The inspection apparatus according to claim 17,
wherein the judging unit adds information on position coordinates of the pixels to the gradation values corresponding to the pixels, and outputs information on coordinates of the position of a defect when judging that the defect is present in the semiconductor substrate.

* * * * *